United States Patent
Couillard

(10) Patent No.: US 10,684,258 B2
(45) Date of Patent: Jun. 16, 2020

(54) EDDY CURRENT INSPECTION INSTRUMENT WITH NOISE SHAPING FILTER

(71) Applicant: Benjamin Couillard, Quebec (CA)

(72) Inventor: Benjamin Couillard, Quebec (CA)

(73) Assignee: Olympus Scientific Solutions Americas Inc., Waltham, MA (US)

( * ) Notice: Subject to any disclaimer, the term of this patent is extended or adjusted under 35 U.S.C. 154(b) by 529 days.

(21) Appl. No.: 15/581,018

(22) Filed: Apr. 28, 2017

(65) Prior Publication Data

US 2017/0315097 A1     Nov. 2, 2017

Related U.S. Application Data

(60) Provisional application No. 62/328,778, filed on Apr. 28, 2016.

(51) Int. Cl.
    *G01N 27/90*     (2006.01)
    *H03L 7/081*     (2006.01)
    *H04B 3/30*     (2006.01)
    *G01R 25/00*     (2006.01)
    *H04L 25/49*     (2006.01)

(52) U.S. Cl.
CPC ......... *G01N 27/9046* (2013.01); *G01R 25/00* (2013.01); *H03L 7/081* (2013.01); *H04B 3/30* (2013.01); *H04L 25/4917* (2013.01)

(58) Field of Classification Search
CPC .................................................. G01N 27/9047
See application file for complete search history.

(56) References Cited

U.S. PATENT DOCUMENTS

2015/0338377 A1* 11/2015 Gueble ............... G01N 27/904
    324/240

FOREIGN PATENT DOCUMENTS

EP      2618140 A2 * 7/2013

* cited by examiner

*Primary Examiner* — Manuel A Rivera Vargas
(74) *Attorney, Agent, or Firm* — Schwegman Lundberg & Woessner, P.A.

(57) ABSTRACT

Quantization noise in an oversampled eddy current digital drive circuit is reduced using a noise shaping filter.

16 Claims, 4 Drawing Sheets

EDDY CURRENT INSPECTION INSTRUMENT WITH NOISE SHAPING FILTER

CROSS-REFERENCE TO RELATED APPLICATIONS

This application claims the benefit and priority of U.S. Provisional patent application Ser. No. 62/328,778 filed Apr. 28, 2016 entitled INCREASED SPEED AND REDUCED NOISE IN EDDY CURRENT INSPECTION, the entire disclosure of which is incorporated herein by reference.

FIELD OF THE INVENTION

The invention relates in general to use of non-destructive testing (NDT) probes for inspection, and in particular to reducing noise in probe signals with particular reference to reducing noise in the drive signal of eddy current probes.

BACKGROUND OF THE INVENTION

Note that the present disclosure is described in terms of a preferred embodiment of the invention for use with eddy current probes. However, the applicability of the invention is not limited to eddy current probes, and all applications of the invention to other types of non-destructive inspection probes, such as ultrasonic probes, are within the scope of the present disclosure.

Eddy Current (EC) is a commonly used method for non-destructive testing and inspection (NDT/NDI). Single-coil probes use a single EC sensor for inspection, whereas Eddy Current Array (ECA) probes use multiple sensors in order to increase the inspection coverage. Using multiple excitation coils and receiving coils (sensors) allows the user to inspect a given surface faster than with a single EC sensor. Array probes using up to 32 sensors are not uncommon.

An important aspect of NDT/NDI with EC probes is management of the noise in the EC signal. In absolute single-coil probes, generator noise coming in on the same line as the much weaker EC receiver signal is a limiting factor. Differential probes permit the receiver to reject most of the excitation signal and consequently differential EC probes are often preferred, even though differential probes, having two coils instead of one, are less compact and more costly than absolute probes. Reducing the generator noise would increase the signal-to-noise ratio (SNR) of absolute probes, making these probes usable in applications where only differential probes could be used before. Alternatively, less power could be used to drive the probes, while obtaining the same SNR as before the generator noise reduction.

For differential probes, generator noise is less of a problem, however some generator noise bleeds through because of probe imbalance or imperfect common-mode rejection of the differential amplifier. Therefore improvement of the SNR would be beneficial also for differential probes.

The same advantages of noise reduction apply both to single EC probes and to ECA coil arrays. Likewise, noise reduction is advantageous for all other types of NDT probes.

Therefore, there exists a need in existing practice for reduction of noise and increase of SNR for NDT/NDI.

SUMMARY OF THE INVENTION

Accordingly, it is a general objective of the present disclosure to increase SNR in ND T/NDI.

It is further an objective of the present disclosure to use noise shaping to reduce generator noise, thereby increasing the SNR of the NDT/NDI measurement.

It is further an objective of the present disclosure to use noise shaping to reduce noise in the drive signal of an EC probe, thereby increasing the SNR of the EC measurement.

DETAILED DESCRIPTION OF PREFERRED EMBODIMENT

Figure 1:
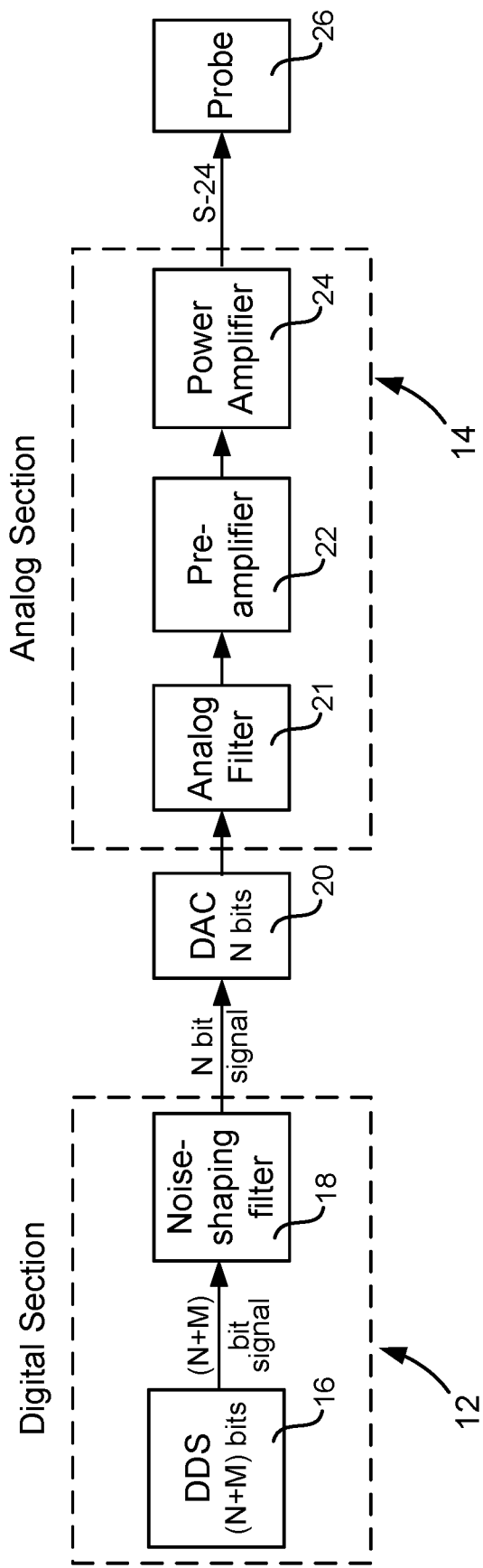
FIG. 1 is a schematic of an EC probe drive circuit according to the present invention.

FIG. 1 shows a schematic of a drive circuit according to the present disclosure for driving an EC probe 26. EC probe 26 may be any type of EC probe including a single-coil probe, a differential probe, a remote-field probe or a probe array. The drive circuit comprises a digital section 12 and an analog section 14, separated by a digital-to-analog converter (DAC) 20. In an embodiment, DAC 20 is a 12 bit converter. Digital section 12 comprises a direct digital synthesizer (DDS) 16 and a noise shaping filter 18. Analog section 14, comprising an analog filter 21, a pre-amplifier 22 and a power amplifier 24, is the generator circuit that provides an excitation signal S-24 having an excitation frequency to drive EC probe 26.

DDS 16 is a digital circuit that generates the EC drive signal, which is typically a sine wave, but may be any combination of multiple sine waves, a chirp, or any other desired form of excitation signal. In order for noise shaping filter 18 to operate as designed, DDS 16 should have a higher number of bits than DAC 20. In an embodiment, DDS 16 is a 20 bit synthesizer.

Noise shaping filter 18 is a key part of the present invention. Noise shaping filter 18 is implemented in digital electronics such as an FPGA, an ASIC, a microprocessor, or a microcontroller, and its function is to take an (N+M) bit input from DDS 16 and convert it to an N bit output, where N is the number of bits of DAC 20 and M is the number of additional bits of DDS 16.

Noise-shaping is a technique generally used to increase the SNR in a specific frequency band of a signal. In the present invention, noise shaping is used to increase the SNR of excitation signal S-24. The SNR of excitation signal S-24 has an important effect on the productivity of EC NDT/NDI because with lower SNR it is necessary to average the EC measurement over more excitation cycles in order to filter out the noise. This reduces productivity by forcing a reduction in the probe scan speed to compensate for the added averaging cycles. In the worst case, the noise in excitation signal S-24 could altogether prevent a meaningful EC measurement. It is thus important to reduce the noise, thereby increasing the SNR in excitation signal S-24 as much as possible.

An important part of the noise in excitation signal S-24 is the quantization noise in DAC 20. For an ideal DAC generating a sine wave, the SNR is given by (see for example W. R. Bennett, "Spectra of Quantized Signals," *Bell System Technical Journal*, Vol. 27, July 1948, p 446-471):

$$\text{SNR (dB)} = 6.02 \ast N + 1.76 \text{ dB} \quad (1)$$

where N is the number of bits. For an ideal DAC, the only noise is the quantization noise, hence the SNR is the ratio between the amplitudes of the sine wave and the quantization noise. For DAC 20 in an embodiment having 12 bits, the SNR according to equation (8) is 74 dB.

DAC 20 samples the excitation signal at a sampling frequency $f_s$ which must respect the following equation (see, for example, Stremler, F. G. (1992), Introduction to Communication Systems, Addison Wesley Longman):

$$f_s > 2 \times \text{excitation frequency} \quad (2)$$

According to equation (2), the sampling frequency, $f_s$, of DAC 20 should be at least twice the excitation frequency of the drive signal of probe 26. If $f_s$ is much higher than the excitation frequency, then the signal is said to be oversampled. For example, to generate a 100 kHz excitation signal the minimum sampling frequency is 200 kHz. Using a 100-MHz sampling frequency would be oversampling by a factor of 500.

Figure 2A:
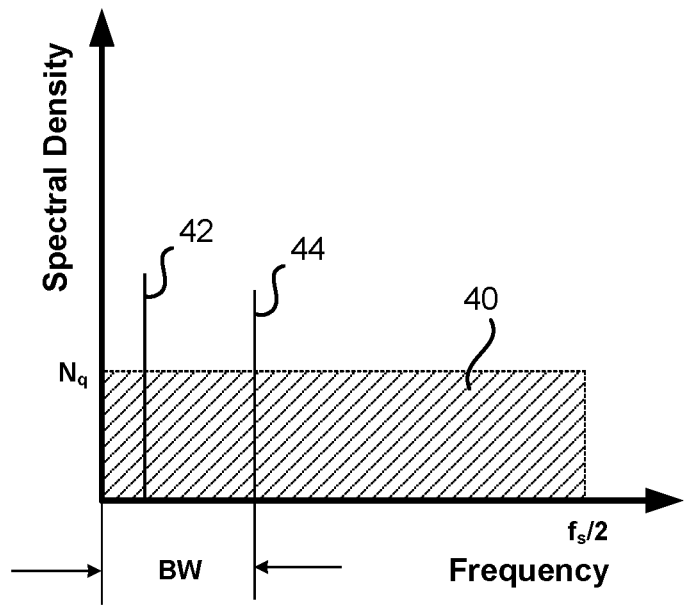
FIG. 2A is a graph of spectral density vs frequency showing quantization noise of a digital-to-analog converter.

FIG. 2A is a graph of spectral density vs frequency showing a quantization noise 40 of an ideal DAC, which is an approximation of real DAC 20. Quantization noise 40 has a total noise power $P_q$ and a constant spectral density $N_q$ spread out over all frequencies from 0 Hz up to a cut-off frequency of $f_s/2$, where $$P_q = \frac{q}{\sqrt{12}} \quad (3)$$

$$N_q = \frac{P_q}{\sqrt{f_s/2}} \quad (4)$$

where q is the least significant bit of DAC 20. Note that with oversampling, $f_s$ has a higher value, thereby spreading the noise over a larger frequency range. FIG. 2A also shows the filtering bandwidth, BW, of analog filter 21 and the corresponding bandwidth cutoff frequency 44. Also shown is an excitation signal 42, which is shown as a line corresponding to the excitation frequency of the generated sine wave.

Figure 2B:
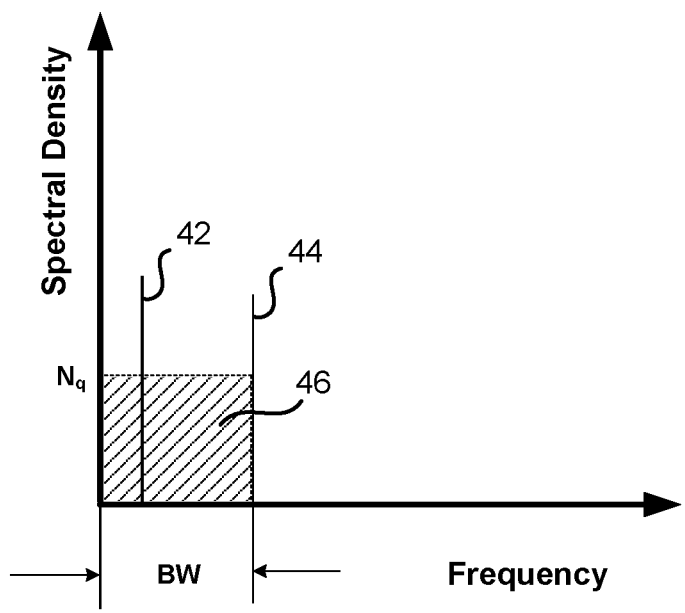
FIG. 2B is a graph of spectral density vs frequency showing filtered quantization noise of a digital-to-analog converter.

FIG. 2B shows a filtered quantization noise 46, which is the result of filtering quantization noise 40 with analog filter 21, wherein analog filter 21 removes frequencies higher than bandwidth cutoff frequency 44. The SNR of excitation signal 42 in FIG. 2B is higher than the SNR of excitation signal 42 in FIG. 2A by an amount:

$$10 \log_{10}(f_s/2 \cdot \text{BW}). \quad (5)$$

This SNR improvement is known as the process gain. For example, when generating a 100-kHz excitation sine wave with a sampling frequency of 100 MHz with an ideal 12-bit DAC, the SNR is 74 dB (equation (1)). By filtering frequencies higher than 1 MHz, the process gain given by equation (5) is $10 \log_{10} (100/2) = 17$ dB. Therefore the SNR of excitation signal 42 in FIG. 2B is improved to 91 dB.

Figure 2C:
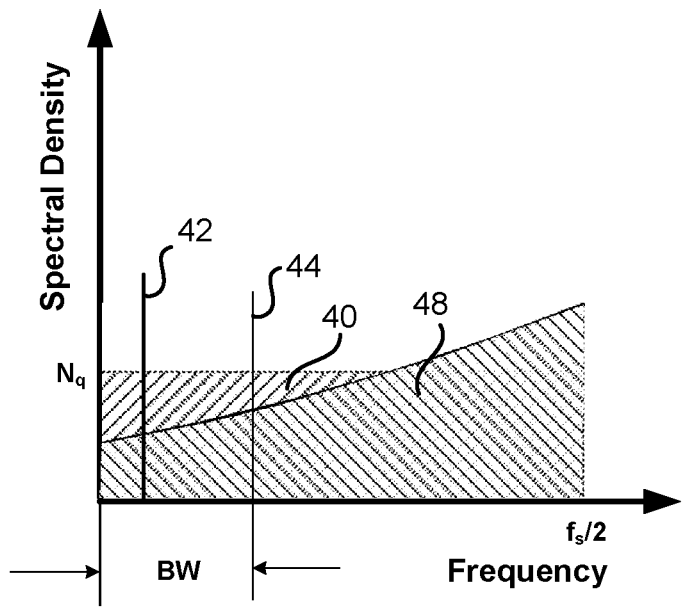
FIG. 2C is a graph of spectral density vs frequency showing the effect on quantization noise of noise shaping according to the present disclosure.

FIG. 2C illustrates the effect of noise shaping on quantization noise 40. Noise shaping filter 18 is used to shape the quantization noise of DAC 20, displacing the noise to higher frequencies and minimizing the noise at lower frequencies. Implementation of noise shaping such as in noise shaping filter 18 is a technique known in the art. In general, to implement noise shaping filter 18, the (N+M) bit signal at its input is compared with the N bit signal at its output, and an error signal is fed back to the input via a digital filter. The higher the order of the filter, the more the quantization noise is displaced to higher frequencies and the more the quantization noise is minimized in the frequencies of interest.

FIG. 2C shows a shaped quantization noise 48, prior to filtering by analog filter 21. The area under the graph of shaped quantization noise 48 is the same as the area under the graph of quantization noise 40, meaning that noise shaping filter 18 has not changed the total noise energy but has only displaced some of that energy to higher frequency.

Figure 2D:
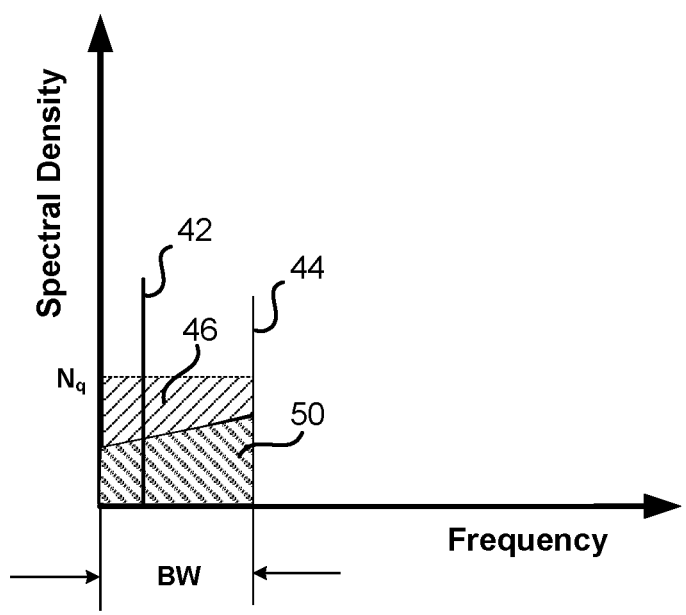
FIG. 2D is a graph of spectral density vs frequency showing the effect on quantization noise of noise shaping and filtering according to the present disclosure.

FIG. 2D shows the result of filtering the noise of FIG. 2C with analog filter 21 after DAC 20, wherein analog filter 21 removes frequencies higher than bandwidth cutoff frequency 44. Shaped quantization noise 48 is filtered to a shaped filtered quantization noise 50. It is seen in FIG. 2D that the area under the graph of shaped filtered quantization noise 50 is much less that the area under the graph of filtered quantization noise 46, meaning that the noise energy has been significantly reduced by application of noise shaping filter 18. The reduction of noise energy is associated with an increase of SNR by approximately 10 to 20 dB, depending on the order of noise shaping filter 18. Therefore, in the example cited above of a 100-kHz excitation sine wave, a sampling frequency of 100 MHz, an ideal 12-bit DAC and a 1 MHz filter cut-off, application of noise shaping filter 18 will increase the SNR from 91 dB to at least 101 dB. This increase of SNR due to noise shaping is a key aspect of the present invention and represents a significant improvement in NDT/NDI using EC or other types of NDT/NDI probes.

Figure 3:
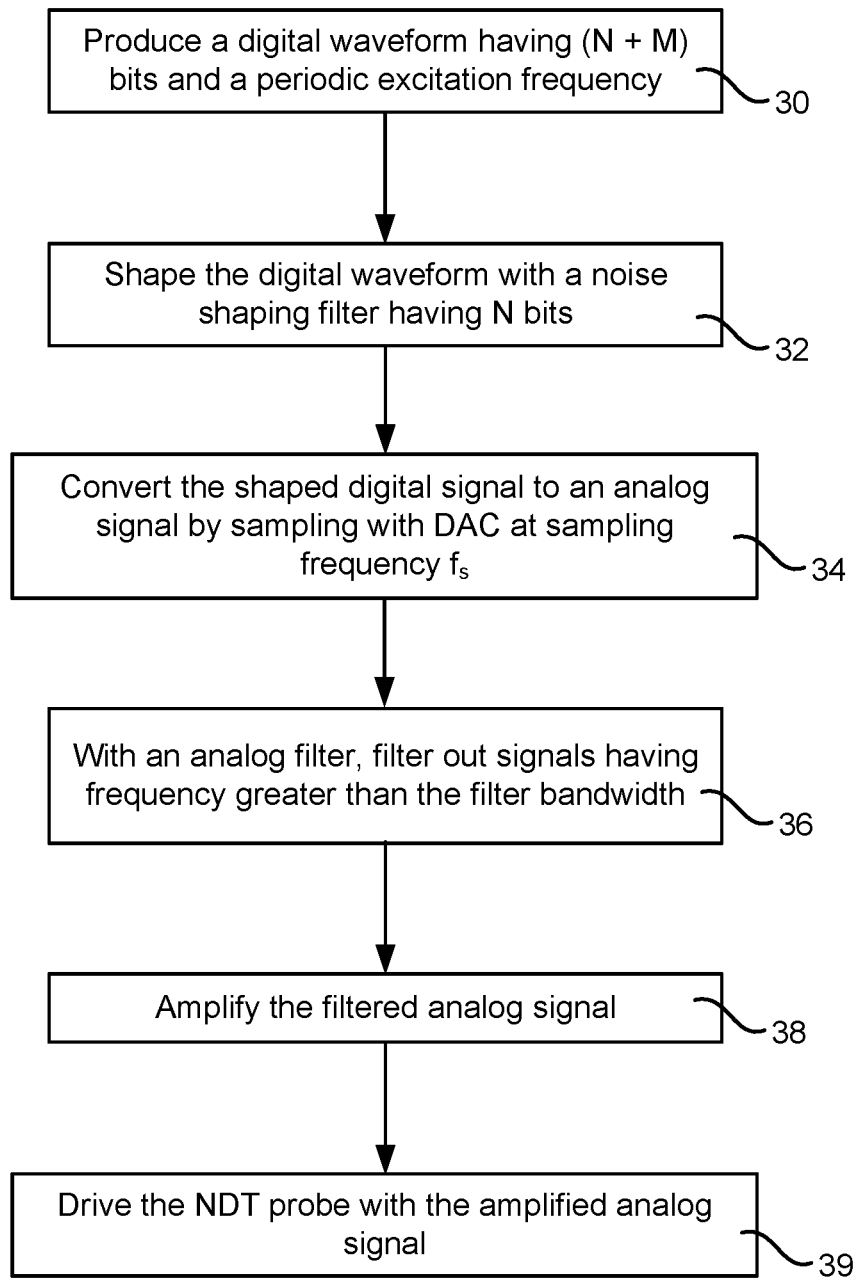
FIG. 3 is a schematic illustration of a noise reduction method according to the present disclosure.

FIG. 3 is a schematic illustration of a noise reduction method according to the present disclosure. In step 30 a digital waveform is produced, having (N+M) bits and a periodic excitation frequency. In step 32 the digital waveform is shaped with a noise shaping filter having N bits. In step 34 the shaped digital signal is converted to an analog signal by sampling with a DAC at sampling frequency L. In step 36 an analog filter is used to filter out signals having frequency greater than the filter bandwidth. In step 38 the filtered analog signal is amplified and in step 39 the amplified signal is used to drive the NDT probe.

Although the present invention has been described in relation to particular embodiments thereof, it can be appreciated that various designs can be conceived based on the teachings of the present disclosure, and all are within the scope of the present disclosure.

What is claimed is:

1. A noise reduction circuit for non-destructive testing (NDT) of a test object with a NDT probe, the circuit comprising:
   a direct digital synthesizer (DDS);
   a noise shaping filter;
   a digital-to-analog converter (DAC);
   an analog filter; and
   amplifier;
   wherein the (DDS) is configured to produce a digital waveform having a periodic excitation frequency and having a number of bits equal to the sum of a first number of bits of the DAC and a second number of bits of the DDS;
   wherein the noise shaping filter is configured to produce a digital shaped output having a number of bits equal to the number of bits of the DAC according to the digital waveform and to shape a noise frequency distribution so that a first noise power corresponding to the excitation frequency is smaller than a second noise power corresponding to frequencies greater than the excitation frequency;

wherein the (DAC) is configured to sample the digital shaped output at a sampling frequency and to produce an analog shaped output having a quantization noise power distributed according to the noise frequency distribution;

wherein the analog filter is configured to produce an analog filtered output by removing from the analog shaped output signals having a frequency greater than a filter bandwidth; and wherein the amplifier is configured to amplify the analog filtered output to produce an amplified analog filtered output.

2. The circuit of claim 1 wherein the NDT probe is an eddy current probe.

3. The circuit of claim 1 wherein the amplified analog filtered output is a drive signal for the NDT probe.

4. The circuit of claim 1 wherein the amplifier comprises a pre-amplifier and a power amplifier.

5. The circuit of claim 1 wherein the digital waveform is a sine waveform.

6. The circuit of claim 1 wherein the DAC is a 12-bit converter and the DDS is a 20-bit synthesizer.

7. The circuit of claim 1 wherein the sampling frequency is greater than twice the excitation frequency.

8. The circuit of claim 1 wherein the sampling frequency is greater than one hundred times the excitation frequency.

9. A method of reducing noise in a circuit for non-destructive testing (NDT) of a test object with a NDT probe, the method comprising the steps of:

producing a digital waveform having a periodic excitation frequency and having a number of bits equal to the sum of a first number of bits of a digital-to-analog converter (DAC) and a second number of bits of a direct digital synthesizer (DDS);

shaping a noise frequency distribution of the digital waveform as a digital shaped output having a number of bits equal to the number of bits of the DAC according to the digital waveform and to shape a noise frequency distribution so that a first noise power corresponding to the excitation frequency is smaller than a second noise power corresponding to frequencies greater than the excitation frequency;

converting the digital shaped output at a sampling frequency to an analog shaped output having a quantization noise power distributed according to the noise frequency distribution;

filtering the analog shaped output to produce an analog filtered output by removing from the analog shaped output signals having a frequency greater than a filter bandwidth; and amplifying the analog filtered output to produce an amplified analog filtered output.

10. The method of claim 9 wherein the NDT probe is an eddy current probe.

11. The method of claim 9 wherein the amplified analog filtered output is a drive signal for the NDT probe.

12. The method of claim 9 wherein amplifying the analog filtered output to produce an amplified analog filtered output comprises pre-amplification and amplification.

13. The method of claim 9 wherein the digital output waveform is a sine waveform.

14. The method of claim 9 wherein the DAC is a 12-bit converter and the DDS is a 20-bit synthesizer.

15. The method of claim 9 wherein the sampling frequency is greater twice the excitation frequency.

16. The method of claim 9 wherein the sampling frequency is greater than one hundred times the excitation frequency.

* * * * *